United States Patent
Uemura

(10) Patent No.: US 10,699,919 B2
(45) Date of Patent: Jun. 30, 2020

(54) COATING PROCESSING APPARATUS AND COATING LIQUID COLLECTING MEMBER

(71) Applicant: TOKYO ELECTRON LIMITED, Tokyo (JP)

(72) Inventor: Ryoichi Uemura, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/111,510

(22) Filed: Aug. 24, 2018

(65) Prior Publication Data

US 2019/0067043 A1   Feb. 28, 2019

(30) Foreign Application Priority Data

Aug. 29, 2017   (JP) .................................. 2017-164762

(51) Int. Cl.
| | |
|---|---|
| H01L 21/67 | (2006.01) |
| H01L 51/00 | (2006.01) |
| B05B 14/30 | (2018.01) |
| B05C 11/02 | (2006.01) |
| H01L 21/673 | (2006.01) |
| H01L 21/687 | (2006.01) |

(52) U.S. Cl.
CPC ........ *H01L 21/67023* (2013.01); *B05B 14/30* (2018.02); *B05C 11/02* (2013.01); *H01L 21/6715* (2013.01); *H01L 21/67017* (2013.01); *H01L 21/67051* (2013.01); *H01L 21/67393* (2013.01); *H01L 21/68764* (2013.01); *H01L 51/0003* (2013.01)

(58) Field of Classification Search
USPC .......................... 118/612, 52, 319, 320, 326
See application file for complete search history.

(56) References Cited

U.S. PATENT DOCUMENTS

| | | | | |
|---|---|---|---|---|
| 2002/0053319 A1* | 5/2002 | Nagamine | ......... | H01L 21/67051 118/52 |
| 2014/0261163 A1* | 9/2014 | Kishita | ............. | H01L 21/67051 118/52 |

FOREIGN PATENT DOCUMENTS

| | | |
|---|---|---|
| JP | 3175893 U | 6/2012 |
| JP | 2014136182 A | 7/2014 |

* cited by examiner

*Primary Examiner* — Yewebdar T Tadesse
(74) *Attorney, Agent, or Firm* — Nath, Goldberg & Meyer; Jerald L. Meyer

(57) ABSTRACT

A coating processing apparatus includes: a substrate holding part for horizontally holding a substrate and configured to rotate around a vertical axis; a coating liquid supply part for supplying a coating liquid onto the substrate; a cup body surrounding the substrate; an annular exhaust path formed along a circumferential direction of the cup body between an inner peripheral surface of the cup body and an inner member installed inside the cup body; a coating liquid collecting member installed to cover the exhaust path and having an opening, and configured to collect the coating liquid scattering from the substrate; at least one solvent storage portion formed in the coating liquid collecting member and configured to store a first solvent for dissolving the coating liquid collected in the coating liquid collecting member; and a solvent supply part for supplying the first solvent to the at least one solvent storage portion.

8 Claims, 9 Drawing Sheets

COATING PROCESSING APPARATUS AND COATING LIQUID COLLECTING MEMBER

CROSS-REFERENCE TO RELATED APPLICATION

This application is based upon and claims the benefit of priority from Japanese Patent Application No. 2017-164762, filed on Aug. 29, 2017, the entire contents of which are incorporated herein by reference.

TECHNICAL FIELD

The present disclosure relates to a technique for collecting and removing a coating liquid scattering from a rotating substrate when coating the rotating substrate with the coating liquid.

BACKGROUND

In a photoresist process which is one type of semiconductor manufacturing processes, a spin coating apparatus for supplying a coating liquid such as a resist or the like onto a surface of a semiconductor wafer (hereinafter, referred to as a wafer) and coating the entire surface of the wafer with the coating liquid while rotating the wafer, has been used. In such a coating processing apparatus, a cup body is installed to surround a wafer held by a spin chuck and to accommodate a coating liquid scattering from the wafer. In addition, an annular exhaust path is formed along a circumferential direction of the cup body, and an ambient atmosphere of the wafer is exhausted via the exhaust path.

In recent years, with the high integration of semiconductor circuits, devices with a more complicated three-dimensional structure have been studied. In a case of manufacturing such devices, from the viewpoint of increasing an etching resistance, there is a demand to make a resist film thick and there is also a need to use a resist liquid having high viscosity of 200 cP or more. When a material having high viscosity is coated by spin coating, a coating liquid dropped from the periphery of a wafer when the coating liquid coated on the wafer is diffused may be deformed to have a string shape. When such a string-shaped coating liquid clogs an exhaust path, there is a problem that an exhaust pressure decreases. As such, there is a need to periodically perform maintenance to remove the string-shaped coating liquid.

As measures against such a string-shaped coating liquid, for example, a configuration has been used in which an annular coating liquid collecting member for collecting the string-shaped coating liquid is installed in an annular exhaust path formed to surround a wafer. By installing such a coating liquid collecting member, it is possible to collect a coating liquid tending to flow into, for example, an exhaust duct located at a downstream side of a cup body. However, such a configuration requires removing the string-shaped coating liquid collected in the coating liquid collecting member.

In some configurations, a rinse is used to clean a rear surface of a wafer, and a coating liquid collecting member is cleaned using the rinse dropped from the wafer. Moreover, the rotation speed of a wafer varies or fluctuates depending on a process recipe of the wafer. This makes it difficult to stably supply a liquid toward the coating liquid collecting member during wafer processing. Therefore, in addition to the process of processing the wafer, it is necessary to supply the rinse toward the coating liquid collecting member to clean the coating liquid collecting member, which results in poor throughput.

In addition, a technique for discharging and removing a solvent toward a string-shaped (thread-shaped) coating liquid generated at the periphery of a rotating wafer has been used. However, the string-shaped coating liquid is easy to scatter, which makes it difficult to reduce an amount of coating liquid captured by an exhaust stream at a suitable level. Further, it is necessary to continue supplying the solvent during a resist coating process. This may increase an amount of chemical solution used.

SUMMARY

Some embodiments of the present disclosure provide a technique capable of collecting and removing a coating liquid scattering from a substrate when performing a coating process on the substrate onto which a coating liquid of high viscosity is supplied while rotating the substrate, and capable of suppressing degradation in throughput.

According to one embodiment of the present disclosure, there is provided a coating processing apparatus including: a substrate holding part configured to hold a substrate in a horizontal posture and rotate around a vertical axis; a coating liquid supply part configured to supply a coating liquid of high viscosity onto the substrate held by the substrate holding part; a cup body installed to surround the substrate held by the substrate holding part; an annular exhaust path formed along a circumferential direction of the cup body between an inner peripheral surface of the cup body and an inner member installed inside the cup body; a coating liquid collecting member installed to cover the exhaust path and having an opening formed to penetrate in a vertical direction, the coating liquid collecting member being configured to collect the coating liquid scattering from the substrate that is rotating by the substrate holding part; at least one solvent storage portion formed in the coating liquid collecting member and configured to store a first solvent for dissolving the coating liquid collected in the coating liquid collecting member; and a solvent supply part configured to supply the first solvent to the at least one solvent storage portion.

According to another embodiment of the present disclosure, there is provided a coating liquid collecting member for use in a coating apparatus configured to supply a coating liquid onto a substrate horizontally held by a substrate holding part that is installed inside a cup body, and discharge the coating liquid dropped from the substrate being rotated via an annular exhaust path formed along a circumferential direction of the cup body between an inner peripheral surface of the cup body and an inner member of the cup body, the coating liquid collecting member being installed to cover the exhaust path, and the coating liquid collecting member being used in the aforementioned coating processing apparatus.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
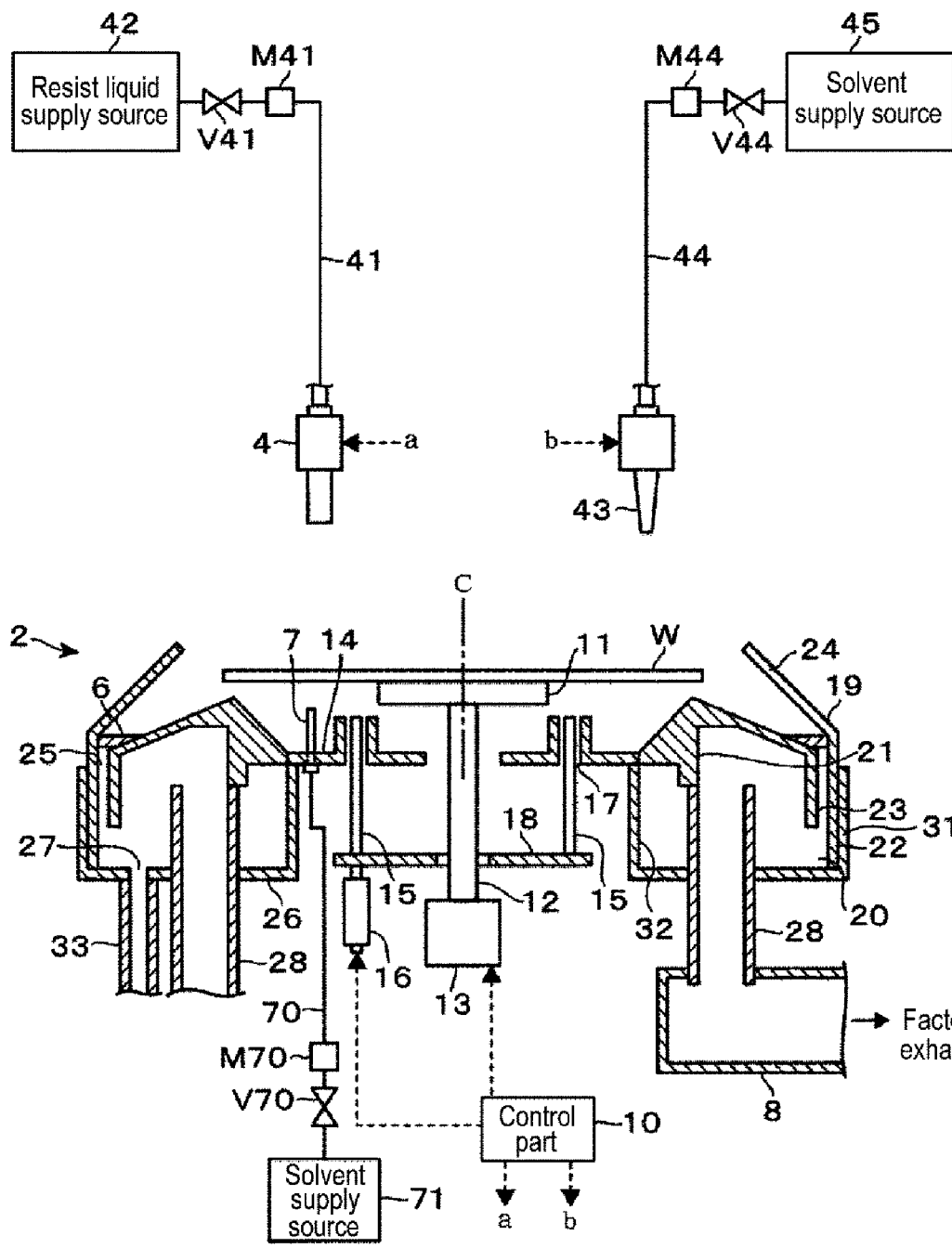
FIG. 1 is a longitudinal sectional view of a resist coating apparatus.

An embodiment in which a coating processing apparatus according to an embodiment of the present disclosure is applied to a resist coating apparatus that coats a resist liquid as a coating liquid on a wafer W with a diameter of 300 mm, will be described. As shown in FIG. 1, the resist coating apparatus according to the embodiment includes a spin chuck 11 which is a substrate holding part that holds the wafer W in a horizontal posture by vacuum-attracting a central portion of a rear surface of the wafer W. The spin chuck 11 is connected to a rotation mechanism 13 via a shaft portion 12, and is rotated around a vertical axis by the rotation mechanism 13 in the clockwise direction when viewed from the top.

A circular plate 14 is installed below the spin chuck 11 so as to surround the shaft portion 12 with a gap formed between the circular plate 14 and the shaft portion 12. The circular plate 14 has three through-holes 17 formed at equal intervals in a circumferential direction. Lifting pins 15 are located in the through-holes 17, respectively. A common lifting plate 18 is installed below the lifting pins 15. The lifting pins 15 are configured to be moved up/down by an elevating mechanism 16 installed below the lifting plate 18.

In addition, the resist coating apparatus includes a resist liquid nozzle 4 which is a coating liquid supply part for supplying a resist liquid onto the wafer W. The resist liquid nozzle 4 is coupled to a resist liquid supply source 42 via a resist liquid supply pipe 41. A resist liquid having a viscosity of, e.g., 5,000 cP is stored in the resist liquid supply source 42. In addition, the resist coating apparatus includes a solvent nozzle 43 for supplying a solvent for diluting the resist liquid, for example, cyclohexanone (CHN), onto the wafer W. The solvent nozzle 43 is coupled to a solvent supply source 45 via a solvent supply pipe 44. In FIG. 1, reference symbols M41 and V41 denote a flow rate adjustment part and a valve installed in the resist liquid supply pipe 41, respectively. Reference symbols M44 and V44 denote a flow rate adjustment part and a valve installed in the solvent supply pipe 44, respectively.

Further, the resist coating apparatus includes a cup body 2 so as to surround the spin chuck 11. The cup body 2 collects waste liquid scattered or flowing down from the rotating wafer W and discharges the collected waste liquid outside the resist coating apparatus. The cup body 2 includes a mountain-like guide portion 21 which has a mountain-like sectional shape and is formed in a ring shape around the circular plate 14. An annular rectifying plate 23 is formed so as to extend downward from an outer peripheral end of the mountain-like guide portion 21. The mountain-like guide portion 21 guides the liquid flowing down from the wafer W outward and downward with respect to the wafer W.

Further, an upper cup body 19 is provided to surround the mountain-like guide portion 21. The upper cup body 19 includes a vertical cylindrical portion 22. An upper guide portion 24 is formed to obliquely extend inward and upward on an upper end of the cylindrical portion 22. An annular gap is defined along the circumferential direction of the cup body 2 between an upper surface of the mountain-like guide portion 21 used as an inner member and the rectifying plate 23 and the cylindrical portion 22 of the upper cup body 19. The gap serves as an exhaust path 25 through which the ambient atmosphere of the wafer W held by the spin chuck 11 is exhausted. Further, the cup body 2 includes a liquid receiving portion 20 located below the mountain-like guide portion 21 and the rectifying plate 23 to receive the resist liquid and the solvent which flow along the mountain-like guide portion 21 and the rectifying plate 23.

The liquid receiving portion 20 is formed in a ring shape having a concave section surrounded by an annular inner wall 32 and an annular outer wall 31 which are made of, for example, stainless steel (SUS). The liquid receiving portion 20 is located in such a manner that the annular inner wall 32 supports the mountain-like guide portion 21 from below and the annular outer wall 31 surrounds the periphery of the cylindrical portion 22 of the upper cup body 19. Two exhaust pipes 28 are installed inward of the rectifying plate 23 in the liquid receiving portion 20 so as to penetrate a bottom surface 26 of the liquid receiving portion 20. The central portion of the liquid receiving portion 20 is located in each of the exhaust pipes 28. Upper ends of the exhaust pipes 28 are opened at a position higher than the bottom surface 26 of the liquid receiving portion 20.

The other ends of the exhaust pipes 28 are connected to an exhaust duct 8 which is connected to a factory exhaust system. Thus, an internal atmosphere of the cup body 2 is exhausted through the exhaust duct 8. The exhaust duct 8 includes a damper (not shown) for switching the exhaust pressure of the cup body 2 depending on an opening degree. Further, a liquid drain port 27 is opened outward of the exhaust pipes 28 in the bottom surface 26 of the liquid receiving portion 20. One end of a liquid drain pipe 33 is connected to the liquid drain port 27.

In addition, a coating liquid collecting member 6 which collects a string-shaped coating liquid dropped from the wafer W is removably installed at an upper portion of the exhaust path 25. The coating liquid collecting member 6 is formed in an annular shape along an opening of the exhaust path 25. An annular flow path 65, a solvent storage portion 64 and the like are formed in the coating liquid collecting member 6, which will be described later. In FIG. 1, for the sake of avoiding complexity of the descriptions, the coating liquid collecting member 6 is shown in the form of a flat plate.

Figure 2:
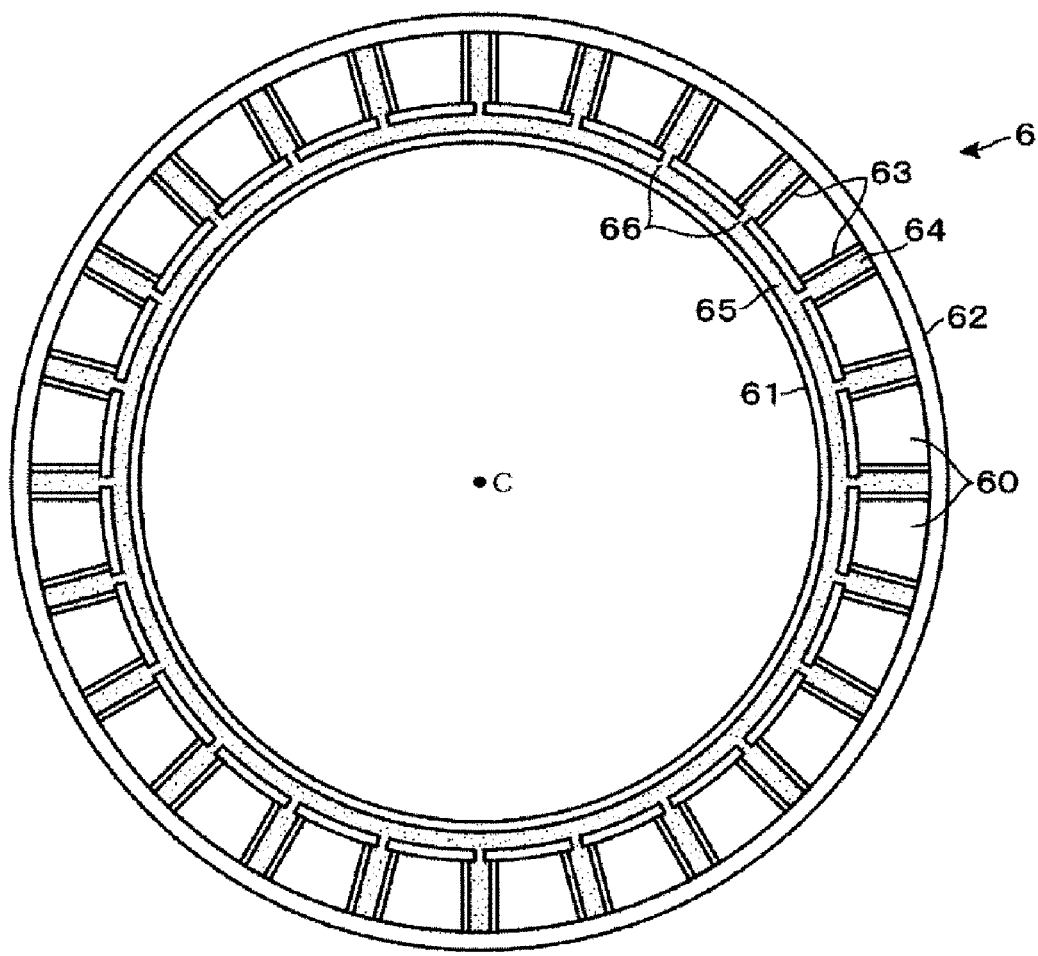
FIG. 2 is a plan view of a coating liquid collecting member according to an example of an embodiment of the present disclosure.
Figure 3:
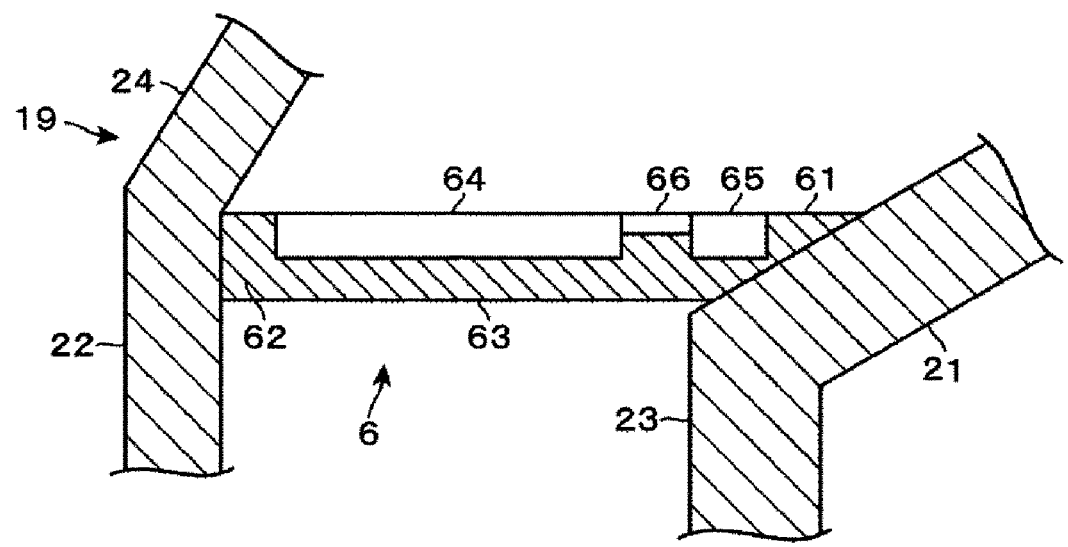
FIG. 3 is a sectional view of the coating liquid collecting member.

As shown in FIGS. 2 and 3, the coating liquid collecting member 6 includes an inner ring 61 and an outer ring 62 which are concentrically arranged with each other around a central portion C of the cup body 2. In the coating liquid collecting member 6, the inner ring 61 is installed on the periphery of an upper surface of the mountain-like guide portion 21, and the outer ring 62 is fixed to an inner surface of the upper cup body 19. A lower surface corresponding to a central side of the cup body 2 in the inner ring 61 is cut so as to along an inclined surface of the mountain-like guide portion 21. Thus, a solvent flowing down toward an outer peripheral side of the mountain-like guide portion 21 flows into an upper surface of the inner ring 61.

A plurality of (e.g., 24) beams 63 is arranged between the inner ring 61 and the outer ring 62 at equal intervals in a circumferential direction of the coating liquid collecting member 6. The beams 63 are formed to horizontally extend in a radial direction of a circle centered at the center portion C of the cup body 2. Assuming that, in a direction in which an exhaust stream flows, the side of the wafer W is referred to as an upstream side and the side of the exhaust duct 8 is referred to as a downstream side, a gap between two adjacent beams 63 of the plurality of beams 63 serves as an opening 60 for allowing an atmosphere of the upstream side of the coating liquid collecting member 6 to flow toward the downstream side. The opening 60 penetrates through the coating liquid collecting member 6 in a thickness direction. A groove-like solvent storage portion 64 having, for example, a length of 15 mm, a depth of 4 mm and a width of 10 mm is formed in an upper surface defined by adjacent beams 63. An annular flow path 65 is formed in an upper surface of the inner ring 61 along the circumferential direction of the inner ring. A flow path 66 through which each of the solvent storage portions 64 is in communication with the annular flow path 65 is formed at a position corresponding to the central side of the cup body 2 in each of the solvent storage portions 64. The annular flow path 65 allows the solvent storage portions 64 to be in communication with each other. Thus, the annular flow path 65 corresponds to a communication path.

FIG. 2 does not represent an example which is assumed when configured as an actual machine but is shown for the sake of a clear understanding of the technology. Further, in FIG. 2, regions where the solvent is stored, namely the solvent storage portions 64, the flow paths 66 and the annular flow path 65 in this example are indicated by dots.

Returning to FIG. 1, a rear surface-side solvent nozzle 7 which is a rear surface-side solvent supply part for discharging a solvent used to prevent a resist from going around the back of the wafer W toward a rear surface of the wafer W held by the spin chuck 11 is installed on the upper surface of the circular plate 14. In this embodiment, the rear surface-side solvent nozzle 7 corresponds to a solvent supply part. One end of a solvent supply path 70 is connected to the rear surface-side solvent nozzle 7, and the other end of the solvent supply path 70 is connected to a solvent supply source 71. In FIG. 1, reference symbol M70 and V70 denote a flow rate adjustment part and a valve installed in the solvent supply path 70, respectively.

As shown in FIG. 1, the resist coating apparatus further includes a control part 10. A program stored in a storage medium such as a flexible disk, a compact disk, a hard disk, a magneto-optical disk (MO), a memory card or the like is installed on the control part 10. The installed program incorporates a group of steps so as to transmit control signals to various parts of the resist coating apparatus and control the operations of the parts.

The operation of the resist coating apparatus described above will be described below. First, a wafer W as a substrate to be processed is mounted on the spin chuck 11. In addition, the solvent nozzle 43 is moved above the central portion of the wafer W. Subsequently, the wafer W is rotated, and the cup body 2 begins to be exhausted at an exhaust pressure of, e.g., 75 Pa. A solvent for pre-wet is supplied from the solvent nozzle 43 toward the wafer W. At this time, the solvent diffuses over the surface of the wafer W and is dropped from the wafer W.

Figure 4:
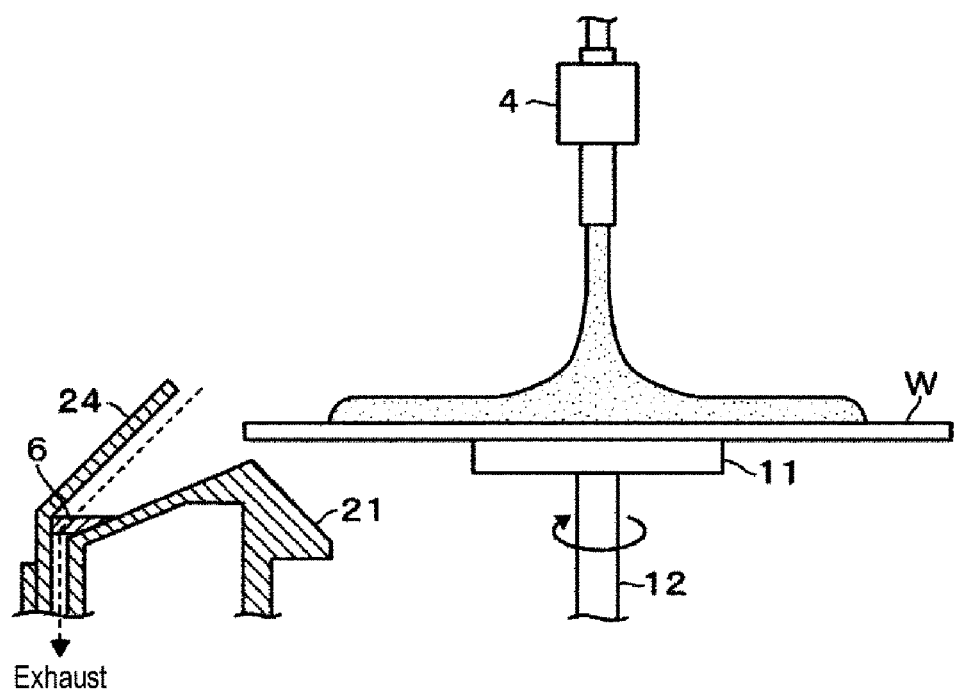
FIG. 4 is an explanatory view showing a state in which a resist is supplied to a wafer.
Figure 5:
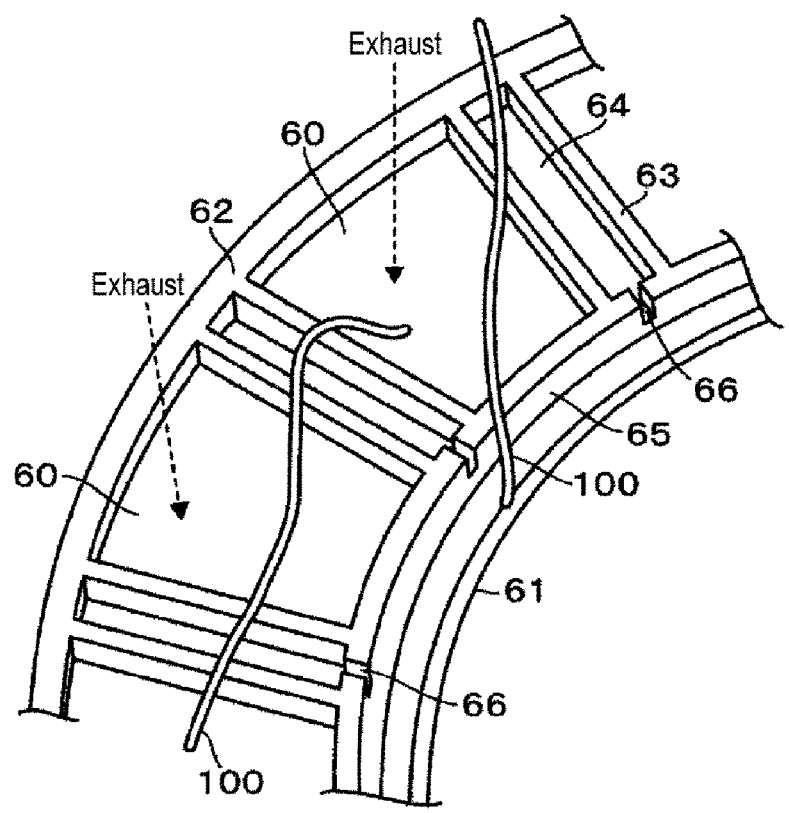
FIG. 5 is an explanatory view showing a state in which a string-shaped coating liquid is collected by the coating liquid collecting member.

Subsequently, the solvent nozzle 43 is withdrawn outward of the wafer W, and the resist liquid nozzle 4 is located above the central portion of the wafer W. Further, as shown in FIG. 4, a resist liquid is supplied toward the wafer W rotating at a rotation speed of, e.g., 800 to 1,500 rpm. Further, the wafer W is rotated at a rotation speed of, e.g., 500 to 1,200 rpm, and the resist liquid diffuses over the surface of the wafer W and is dropped from the wafer W. The resist liquid dropped from the wafer W flows downward along the inner surface of the cylindrical portion 22 of the upper cup body 19 and is discharged from the liquid drain port 27. When the viscosity of the resist liquid is at a high level of, for example, 50 cP or more, some of the resist liquid dropped from the periphery of the wafer W may become a string-shaped coating liquid with high viscosity. Since the cup body 2 is exhausted via the exhaust path 25 which is the gap between the cup body 2 and the mountain-like guide portion 21, an exhaust stream is formed as indicated by a broken line in FIG. 4. Therefore, a string-shaped coating liquid 100 formed as shown in FIG. 5 flows on the exhaust stream and is caught and collected by the beams 63 when the exhaust stream passes through the opening 60 of the coating liquid collecting member 6 installed at the upper portion of the exhaust path 25.

Figure 6:
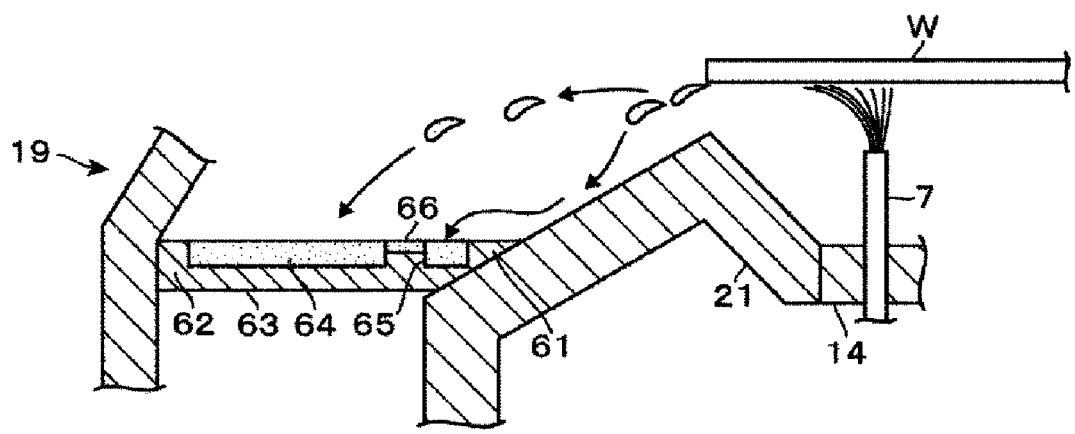
FIG. 6 is an explanatory view showing a state in which a solvent supplied from a rear surface-side solvent nozzle is stored in a solvent storage part.
Figure 7:
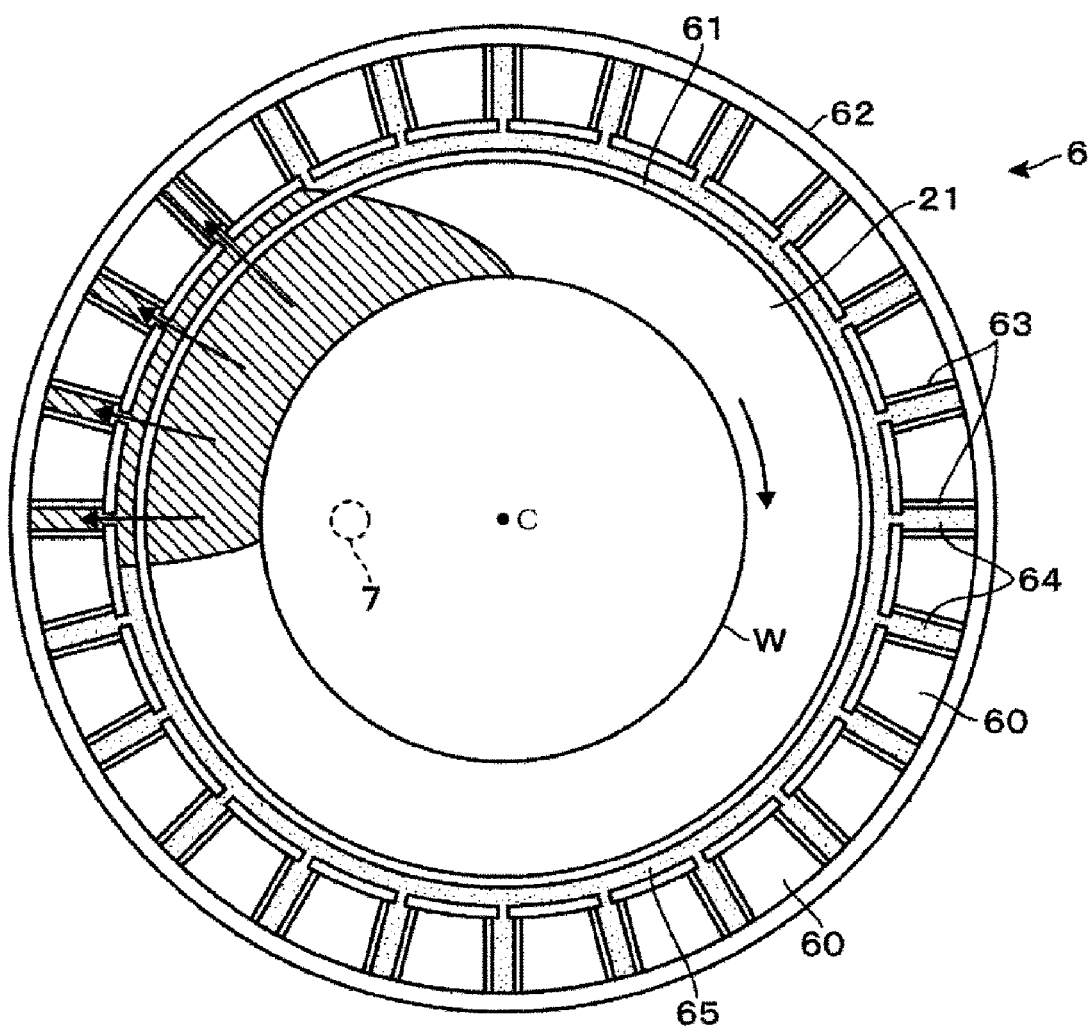
FIG. 7 is an explanatory view showing a state in which the solvent is stored in the solvent storage part.

Next, a step of supplying a solvent to the solvent storage portion 64 of the coating liquid collecting member 6 will be described. The resist liquid nozzle 4 is withdrawn outward of the cup body 2. As shown in FIG. 6, in a state where the wafer W is rotated at a rotation speed of, e.g., 100 rpm, the solvent is supplied at a flow rate of 100 mL/sec for 10 seconds from the rear surface-side solvent nozzle 7 toward the periphery of the rear surface of the wafer W. At this time, the solvent supplied to the side of the rear surface of the wafer W is shaken off by the rotation of the wafer W. As shown in FIGS. 6 and 7, the shaken-off solvent flows toward the periphery of the cup body 2 along the upper surface of the mountain-like guide portion 21, flows into the annular flow path 65 of the coating liquid collecting member 6, and then flows into the solvent storage portion 64 via the flow path 66. Further, the solvent shaken off and scattered from the wafer W flows into the solvent storage portion 64. At this time, the string-shaped coating liquid 100 collected in the coating liquid collecting member 6 shown in FIG. 5 is dissolved by the solvent and melted into the solvent in the solvent storage portion 64. Alternatively, a coating liquid with a decreased viscosity may be liquefied to flow along the inner surface of the cup body 2, and subsequently, may be discharged and removed from the liquid drain port 27 in the lower portion of the cup body 2. Note that a hatched area in each of FIGS. 7 and 8 describes an image of the flow and diffusion of the solvent and do not show an area in which the solvent dropped from the wafer W actually flows.

Figure 8:
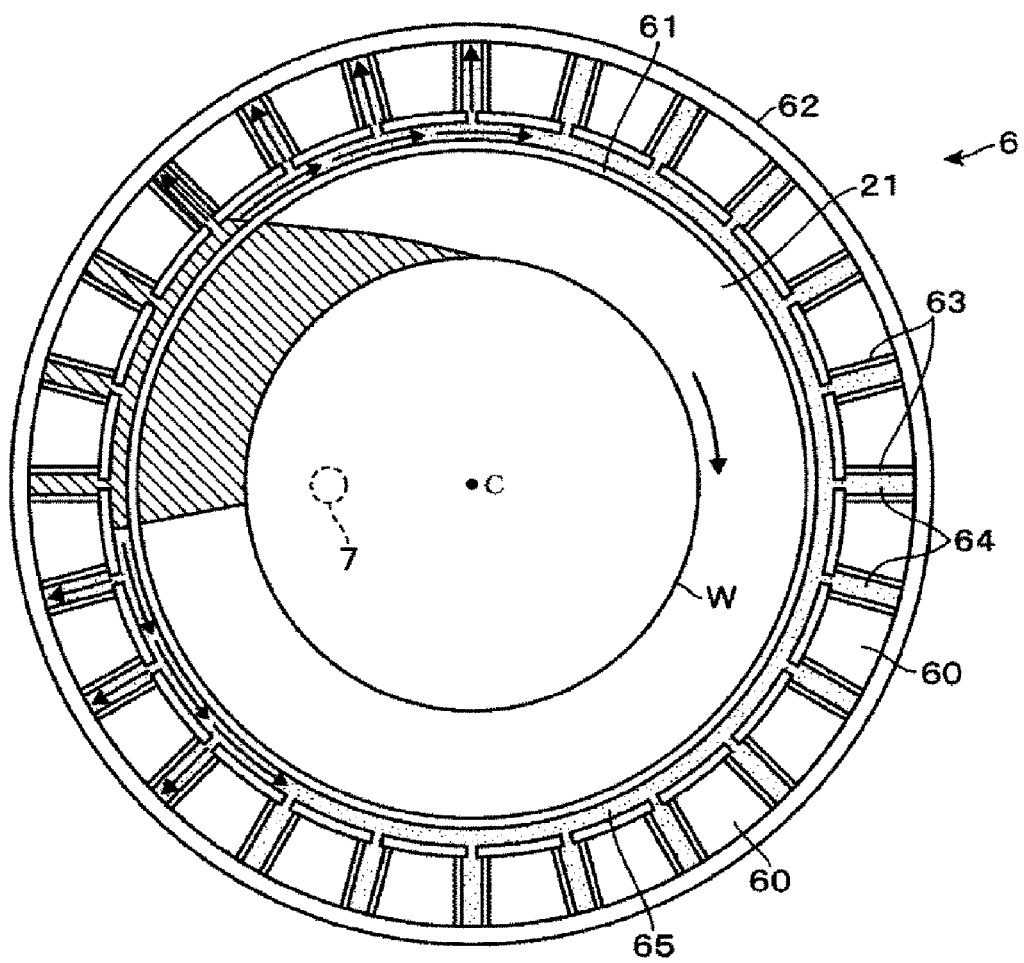
FIG. 8 is an explanatory view showing a state in which the solvent is stored in the solvent storage part.

As shown in FIG. 8, the solvent flowing into the annular flow path 65 diffuses over the entire circumference of the cup body 2 along the annular flow path 65. In the solvent storage portions 64, the solvent flows into and is stored in the solvent storage portions 64 into which a small amount of solvent dropped from the wafer W is flown, for example, the solvent storage portions 64 located at locations opposite a position at which the rear surface-side solvent nozzle 7 is installed, when viewed from the central portion C of the cup body 2, via the flow path 66. Thus, the solvent is also supplied to the string-shaped coating liquid 100 collected in the coating liquid collecting member 6 at the locations opposite to the position at which the rear surface-side solvent nozzle 7 is installed. This dissolves and removes the string-shaped coating liquid 100. In this way, the solvent dropped from the wafer W diffuses through the annular flow path 65 extending over the entire circumference of the cup body 2 and flows into the respective solvent storage portions 64. As a result, the solvent is stored in the respective solvent storage portions 64 at substantially equal amounts.

Subsequently, the wafer W subjected to the resist coating process is taken out by an external transfer arm (not shown). A subsequent wafer W to be processed is delivered on the spin chuck 11. Further, as described above, the solvent nozzle 43 is located above the central portion of the wafer W to discharge the solvent. In this way, a pre-wetting is performed.

Thereafter, the solvent nozzle 43 is withdrawn outward of the cup body 2, and the resist liquid nozzle 4 is located above the central portion of the wafer W. Subsequently, the wafer W is rotated and the resist liquid is discharged from the resist liquid nozzle 4 in the same manner as in the above-described example. At this time, as described above, some of the resist liquids dropped from the wafer W form into string-shaped coating liquids 100.

Figure 9:
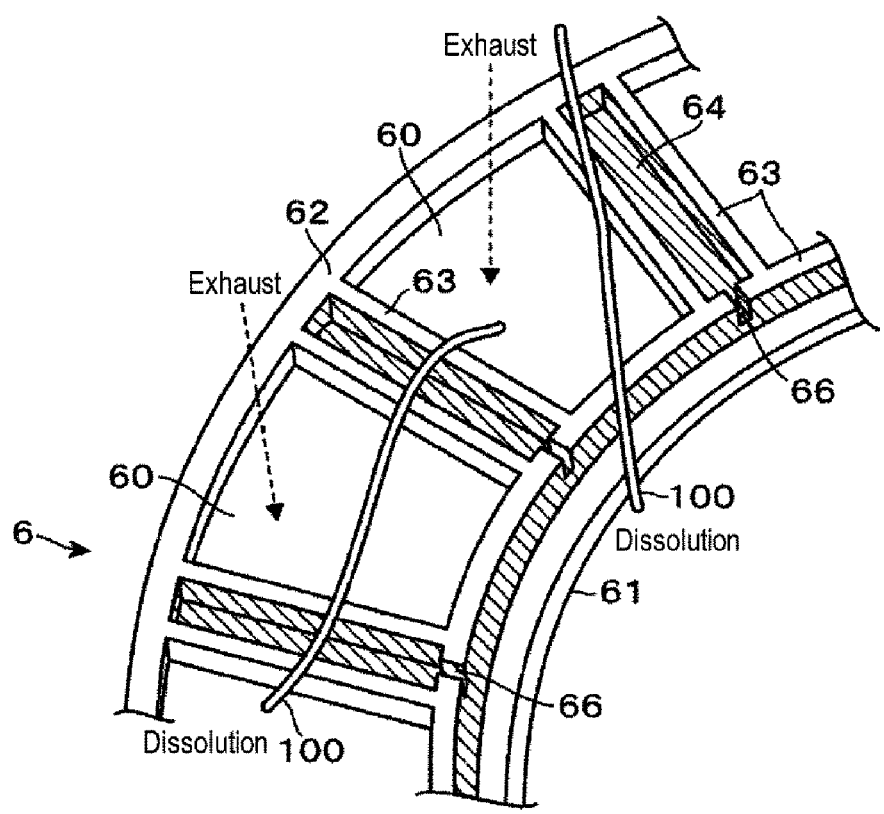
FIG. 9 is an explanatory view showing a state in which the string-shaped coating liquid is dissolved and removed.

The string-shaped coating liquids 100 thus formed are caught by the exhaust stream formed in the exhaust path 25, and is collected by the coating liquid collecting member 6 while flowing along the exhaust stream. At this time, as described above, the solvent remains stored in each of the solvent storage portions 64, each of the flow paths 66 and the annular flow path 65, which are formed over the entire circumference of the cup body 2. Therefore, as shown in FIG. 9, the string-shaped coating liquids 100 collected in the coating liquid collecting member 6 are brought into quick contact with the solvent which fills each of the solvent storage portions 64, each of the flow paths 66 and the annular flow path 65, and are dissolved by the solvent. In this way, by putting a portion of the coating liquid collecting member 6 at which the coating liquid is collected in a state where the solvent is stored, even during the coating process of the wafer W, the collected string-shaped coating liquid 100 is gradually brought into contact with the solvent so that the collected string-shaped coating liquid 100 is dissolved and removed by the solvent. In FIG. 9, hatched portions indicate solvent that is filled in each of the solvent storage portions 64, each of the flow paths 66 and the annular flow path 65. Thereafter, even during the diffusion of the resist over the surface of the wafer W, the coating liquid 100 continues to be dissolved and removed. Even during replacement of the wafer W, the solvent remains stored in each of the solvent storage portions 64, each of the flow paths 66 and the annular flow path 65. Thus, the string-shaped coating liquids 100 remaining without being completely removed continue to be dissolved and removed.

In this way, even while the wafer W is being subjected to the coating process, the string-shaped coating liquids 100 collected in the coating liquid collecting member 6 can be brought into contact with the solvent. This makes it possible to promptly dissolve and remove the string-shaped coating liquids 100. It is therefore possible to suppress the string-shaped coating liquids 100 from being accumulated in the coating liquid collecting member 6. Accordingly, it is possible to reduce the frequency of cleaning maintenance of the coating liquid collecting member 6, which is performed in addition to the process of coating the resist liquid on the wafer W. This suppresses degradation in throughput.

According to the above embodiment, in the resist coating apparatus that performs the coating process by rotating the wafer W on which the resist liquid is supplied, the coating liquid collecting member 6 configured to collect the string-shaped coating liquids 100 generated with the rotation of the wafer W is installed in the exhaust path 25 which is installed along the circumferential direction of the cup body 2, and the solvent storage portions 64 are formed in the coating liquid collecting member 6. With this configuration, when the solvent is supplied onto the rear surface of the wafer W, the solvent dropped from the wafer W falls on the coating liquid collecting member 6 and is stored in the solvent storage portions 64. Further, by keeping a state in which the solvent is stored in the solvent storage portions 64, further string-shaped coating liquids 100, which are generated when the resist coating process is performed on a subsequent wafer W and which are collected in the coating liquid collecting member 6, can be dissolved and removed even during the resist coating process. Accordingly, it is possible to reduce the frequency of cleaning maintenance of the coating liquid collecting member 6, which is performed in addition to the process of coating the resist liquid on the wafer W. This suppresses degradation in throughput.

Figure 10:
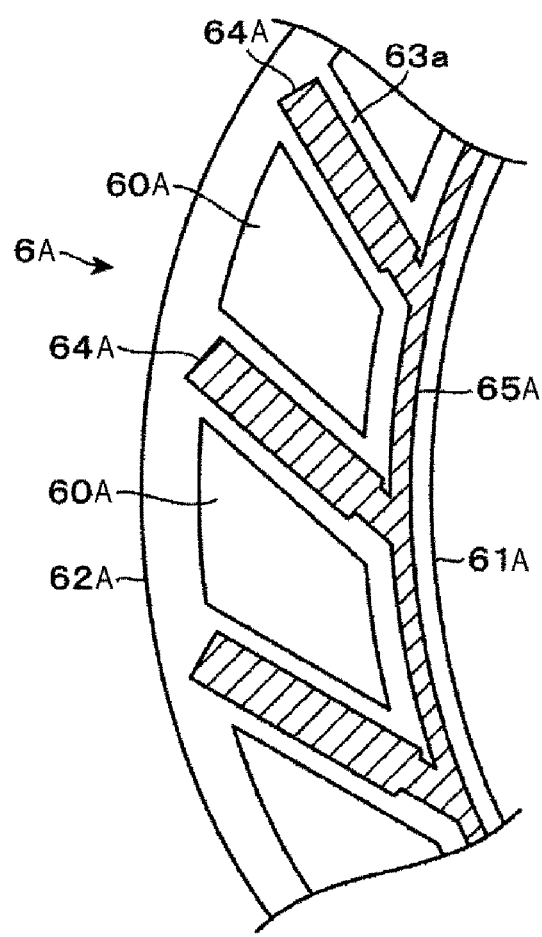
FIG. 10 is a plan view showing a portion of a coating liquid collecting member according to another example of the embodiment of the present disclosure.

A coating liquid collecting member 6A according to another example of the embodiment of the present disclosure will be described below. For example, as shown in FIG. 10, beams 63a by which the solvent storage portions 64A are formed may be configured to extend obliquely with respect to the radial direction of the cup body 2.

Figure 11:
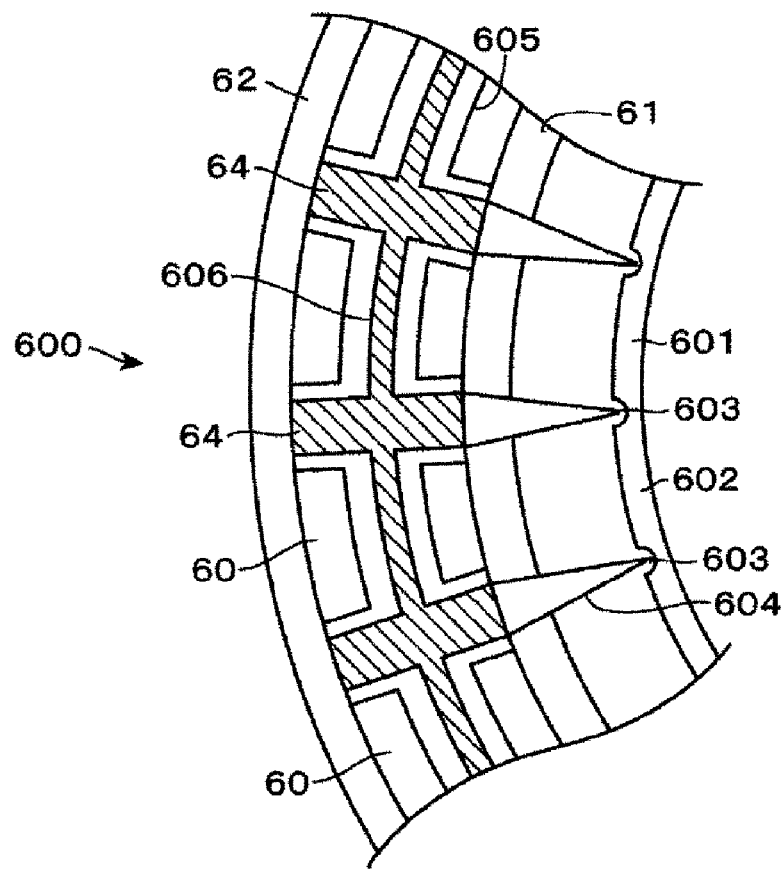
FIG. 11 is a plan view showing a portion of a coating liquid collecting member according to still another example.
Figure 12:
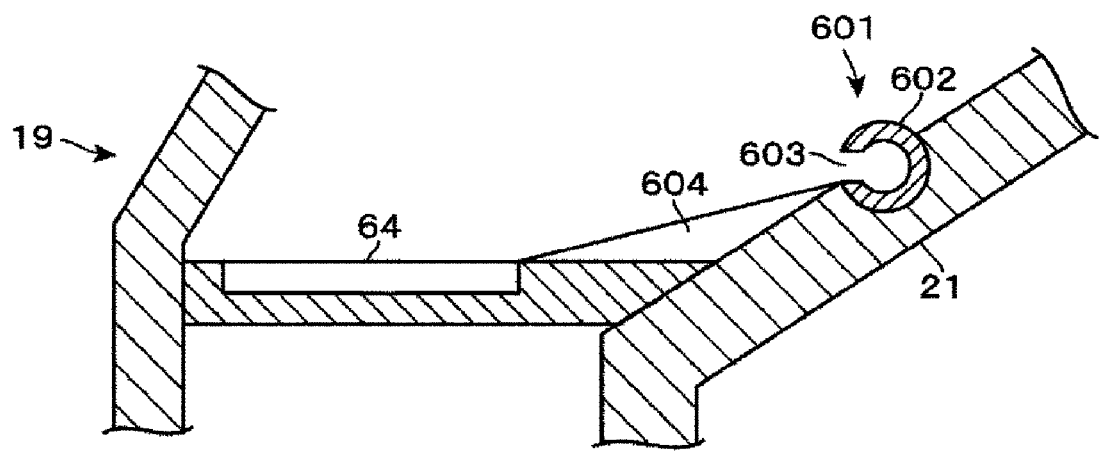
FIG. 12 is a sectional view of a coating liquid collecting member according to yet still another example.

In some embodiments, a solvent supply part for supplying a solvent toward the solvent storage portions 64 may be installed in the cup body 2. As shown in FIGS. 11 and 12, for example, a solvent supply part 601 for discharging a solvent toward a coating liquid collecting member 600 is installed in the upper surface of the mountain-like guide portion 21 of the cup body 2. The solvent supply part 601 is configured by, for example, an annular solvent supply pipe 602. A plurality of solvent discharge holes 603 is formed in an outer peripheral surface of the solvent supply part 601 to face the solvent storage portions 64.

In addition, a plurality of guide members 604 for guiding the solvent discharged from the solvent discharge holes 603 toward the respective solvent storage portions 64 is installed between the solvent supply part 601 and the respective solvent storage portions 64. Further, beams 605 are installed on a circle passing through the center portion of each of the solvent storage portions 64 and which is centered at the center portion C of the cup body 2. A communication path 606 for connecting between the solvent storage portions 64 is formed in the beams 605, respectively. In FIG. 11, the solvent storage portions 64 and the communication path 606 are indicated by hatching.

In the coating processing apparatus configured as above, for example, before performing the process of coating the coating liquid on the wafer W, the solvent may be supplied from the solvent supply part 601 so that the solvent storage portions 64 and the communication path 606 are filled with the solvent. With this configuration, it is possible to quickly dissolve and remove string-shaped coating liquids generated and collected in the coating process. Accordingly, it is possible to decompose and remove the string-shaped coating liquids while performing the coating process on the wafer W, which makes it possible to reduce the frequency of cleaning maintenance of the coating liquid collecting member 600. This improves throughput of the apparatus.

In some embodiments, for example, the inner ring 61 may be formed by a tubular solvent supply pipe to discharge the solvent toward each beam. Even with such a configuration, it is possible to store the solvent in solvent storage portions formed in the beams. This embodiment provides the same effects as the above embodiment.

In some embodiments, for example, each of solvent storage portions may be formed of a mesh-like member, which is installed on an upper surface of a beam. A solvent may be infiltrated and stored in the mesh-like member. By setting the mesh-like members to have, for example, water absorptivity capable of holding enough solvent to be stored in the solvent storage portions 64 formed in the coating liquid collecting member 6 shown in FIG. 2, it is possible to quickly dissolve and remove string-shaped coating liquids collected in the coating liquid collecting member 6. This decreases the number of cleaning processes.

In the above embodiment, the plurality of solvent storage portions 64 is formed at equal intervals over the entire circumference of the cup body 2. Therefore, it is possible to dissolve and remove the string-shaped coating liquids 100 collected over the entire circumference of the cup body 2 regardless of a portion of the coating liquid collecting member 6. This makes it difficult for the string-shaped coating liquid 100 to be locally accumulated in the coating liquid collecting member 6, which suppresses an increase in frequency of maintenance.

Further, the solvent storage portions 64 are configured to be in communication with each other via the annular flow path 65. Therefore, it is possible to supply the solvent to the solvent storage portions 64 over the entire circumference of the cup body 2 regardless of the position of a solvent supply part. Accordingly, it is possible to uniformly supply the solvent to the solvent storage portions 64 formed over the entire circumference of the cup body 2. This makes the efficiency of dissolving and removing the string-shaped coating liquids 100 in the circumferential direction of the cup body 2 uniform. In addition, the communication path may be formed in an arc shape as long as it can communicate the solvent storage portions 64 arranged in the circumferential direction of the cup body 2 with each other. Alternatively, a plurality of arc-shaped communication paths may be arranged in the circumferential direction of the cup body so that the solvent storage portions 64 are in communication with each other.

In addition, as shown in FIG. 2, in the resist coating apparatus of the above embodiment, the annular flow path 65 of the coating liquid collecting member 6 is annularly located inward of the opening 60 in the cup body 2 along the circumferential direction of the cup body 2. This makes it possible to surely guide the solvent, which is dropped from the wafer W and flows on the upper surface of the mountain-like guide portion 21, to the solvent storage portions 64 without dropping into the opening 60. Accordingly, the recovery efficiency of the solvent dropped from the wafer W is high.

Further, the beams 63 are installed to extend in the radial direction of the cup body 2, and the solvent storage portions 64 are formed to extend along the extending direction of the beams 63, respectively. As a result, the solvent is stored over a large range in the width direction of the exhaust path 25. This makes it easier for the string-shaped coating liquids 100 collected in the coating liquid collecting member 6 to be brought into contact with the solvent.

Further, in the above embodiment, the rear surface-side solvent nozzle 7 is used as a solvent supply part for supplying the solvent to the solvent storage portions 64. Therefore, it is possible to supply the solvent to the solvent storage portions without installing an additional solvent supply part. Further, the process of supplying the solvent from the rear surface-side solvent nozzle 7 onto the wafer W has an advantage that, since the supply amount of solvent is large, a suitable amount of solvent can be stored in the solvent storage portions 64 when the wafer W is subjected to a rear surface-side cleaning process according to a recipe.

In some embodiments, the solvent supplied from the solvent nozzle 43 toward the wafer W may be stored in the solvent storage portions 64. For example, a solvent for pre-wetting may be supplied from the solvent nozzle 43 toward the rotating wafer W held by the spin chuck 11 before the process of coating the resist liquid on the wafer W, and the solvent dropped from the wafer W may be stored in the solvent storage portions 64.

As the wafer W used for supplying the solvent to the solvent storage portions 64, for example, a wafer tailored to store the solvent is taken out by a transfer arm from a holding shelf installed inside a liquid processing system in which a coating processing apparatus is disposed, and is transferred to the coating processing apparatus. Alternatively, instead of a wafer W dedicated to cleaning, for example, a front wafer W of an initial lot (wafer W as a product) may be used.

EXAMPLE

In order to verify the effect of suppressing a fluctuation in exhaust pressure, which is obtained by installing a coating liquid collecting member, the resist coating apparatus shown in FIG. 1 was used to perform a resist liquid coating process on 100 sheets of wafers W in a state where a set exhaust pressure of the cup body 2 set according to an opening degree of a damper installed in the exhaust duct 8 is set to 50 Pa, in accordance with the method described in the embodiment. When 0, 25, 50, 75 and 100 sheets of wafers W were processed, an exhaust pressure inside the cup body 2 (at a downstream side of the coating liquid collecting member 6) was measured. In addition, a comparative example was conducted in the same manner as in the example except that the coating liquid collecting member 6 was not installed.

Figure 13:
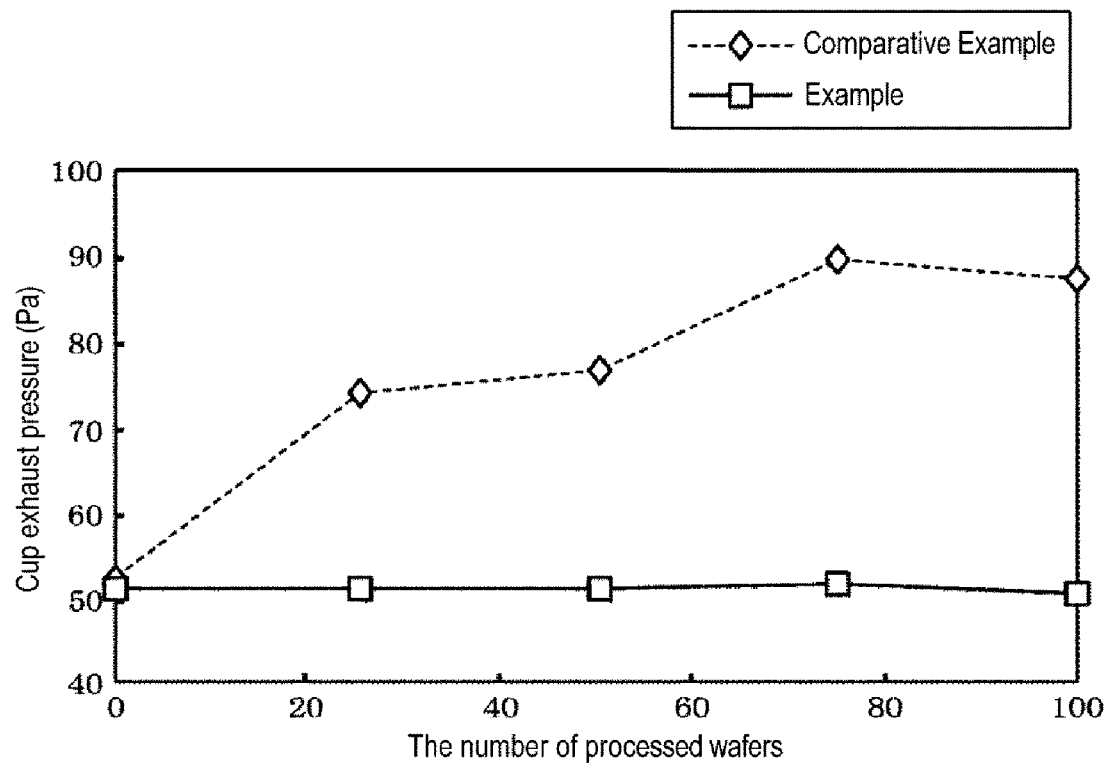
FIG. 13 is a characteristic diagram showing a change in exhaust pressure of a cup body in an example and comparative example.

FIG. 13 is a characteristic diagram showing the results of the above processes, in which the horizontal axis represents the number of processed wafers and the vertical axis represents the exhaust pressure. As shown in FIG. 13, in the comparative example, it can be seen that the exhaust pressure increases as the number of processed wafers W increases. In contrast, in the example, it can be seen that the exhaust pressure remains stable at the exhaust pressure of about 50 Pa. It is inferred that this is because, in the comparative example, string-shaped coating liquids are accumulated in the coating liquid collecting member 6 and the opening 60 is clogged to increase the internal exhaust pressure of the cup body 2 whereas in the example, the accumulation of the string-shaped coating liquids in the coating liquid collecting member 6 is eliminated to prevent the internal exhaust pressure of the cup body 2 from rising.

Further, the resist coating apparatus of the above example was used to perform a coating process on wafers W and a change in internal exhaust pressure of the cup body 2 when the number of processed wafers was increased up to 840 was examined. At each stage when the number of processed wafers W was 100, 440, 620, 720 and 840, the opening degree of the damper was adjusted, and the internal exhaust pressure of the cup body 2 (at the downstream side of the coating liquid collecting member 6) at each of a set opening degree at the time of low exhaust (the exhaust pressure is 20 Pa before the wafers W are processed) and a set opening degree at the time of high exhaust (the exhaust pressure is 75 Pa before the wafers W are processed) was measured.

Figure 14:
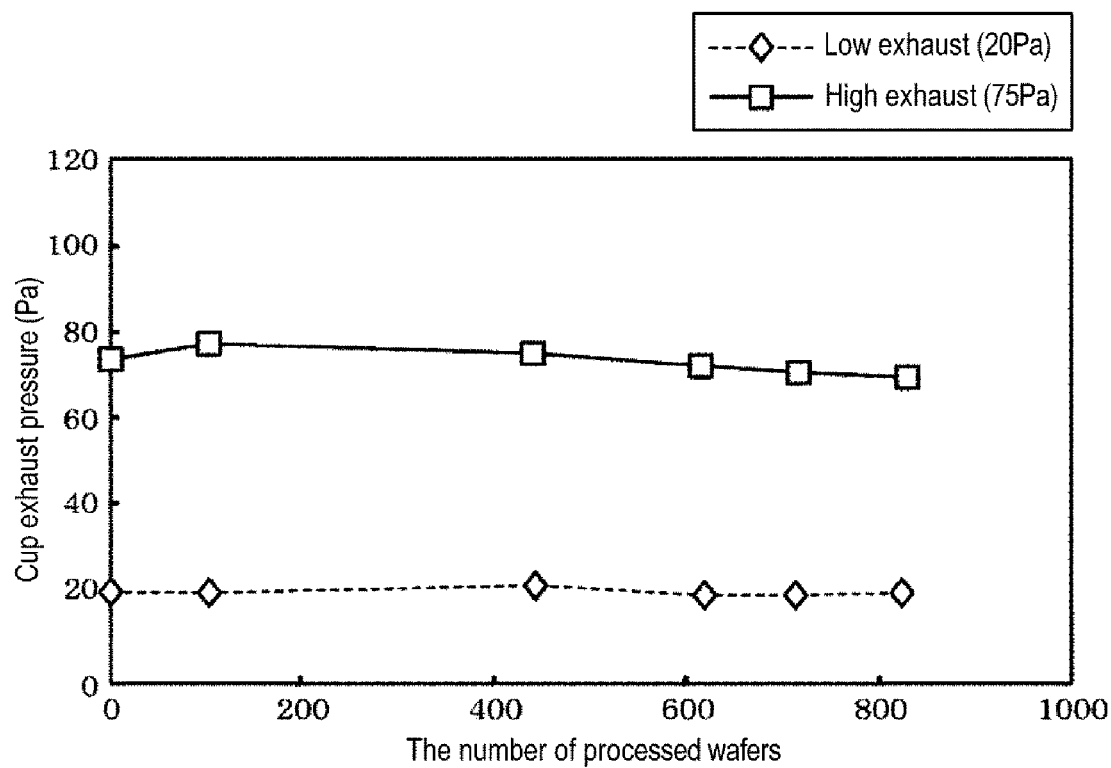
FIG. 14 is a characteristic diagram showing a change in exhaust pressure of a cup body in an example.

FIG. 14 is a characteristic diagram showing the results of the above processes, which shows a change in exhaust pressure at each of set opening degrees of the damper at the low exhaust and the high exhaust. In FIG. 14, the horizontal axis represents the number of processed wafers and the vertical axis represents the internal exhaust pressure of the cup body 2.

The results show that, even when the number of processed wafers W is increased up to 840, little change in exhaust pressure appears in both the set opening degrees of the damper at the low exhaust and the high exhaust. Therefore, it can be seen that clogging of the opening 60 by the string-shaped coating liquids in the coating liquid collecting member 6 hardly occurs even when the number of processed wafers W increases. Thus, it is inferred that the frequency of maintenance is kept from being increased.

According to the present disclosure in some embodiments, in a resist coating apparatus for performing a coating process on a substrate while rotating the substrate onto which a coating liquid of high viscosity is supplied, the atmosphere of the substrate is exhausted from an exhaust path which is a gap between a cup body surrounding the periphery of the substrate and an internal member, and a coating liquid collecting member having a vertically-penetrating opening formed therein is installed in the exhaust path. Further, solvent storage portions for storing a solvent therein are formed in the coating liquid collecting member. Therefore, by supplying the solvent to the solvent storage portions, coating liquids collected in the coating liquid collecting member are promptly dissolved and removed. Accordingly, it is possible to remove the collected coating liquids and suppress such coating liquids from being accumulated in the coating liquid collecting member, while performing the coating process on the substrate. It is therefore possible to suppress degradation in throughput.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A coating processing apparatus comprising:
    a substrate holding part configured to hold a substrate in a horizontal posture and rotate around a vertical axis;
    a coating liquid supply part configured to supply a coating liquid of high viscosity onto the substrate held by the substrate holding part;
    a cup body installed to surround the substrate held by the substrate holding part;
    an annular exhaust path formed along a circumferential direction of the cup body between an inner peripheral surface of the cup body and an inner member installed inside the cup body;
    a coating liquid collecting member installed to cover the annular exhaust path and configured to collect the coating liquid scattering from the substrate that is rotated by the substrate holding part;
    a plurality of beams arranged in a circumferential direction of the coating liquid collecting member and formed to extend in a radial direction of a circle centered at a center portion of the cup body, a plurality of openings being formed between the plurality of beams to penetrate in a vertical direction;
    a plurality of groove-typed solvent storage portions formed in upper surfaces of the plurality of beams, respectively, and configured to store a first solvent for dissolving the coating liquid collected in the coating liquid collecting member, and
    a solvent supply part configured to supply the first solvent to the plurality of solvent storage portions.

2. The coating processing apparatus of claim 1, wherein the groove-typed solvent storage portions are formed in the annular exhaust path in the circumferential direction.

3. The coating processing apparatus of claim 2, wherein the groove-typed solvent storage portions are in communication with each other by a communication path formed to extend in the circumferential direction of the annular exhaust path.

4. The coating processing apparatus of claim 1, wherein the groove-typed solvent storage portions are formed to extend in a radial direction of the cup body.

5. The coating processing apparatus of claim 1, wherein the solvent supply part includes a rear surface-side solvent supply part configured to supply the first solvent toward a rear surface of the substrate held by the substrate holding part, and
    wherein the first solvent supplied from the rear surface-side solvent supply part and dropped from the substrate with the rotation of the substrate is stored in the at least one solvent storage portion.

6. The coating processing apparatus of claim 1, wherein the solvent supply part includes a solvent nozzle configured to supply a second solvent toward the surface of the substrate held by the substrate holding part, and
    wherein the second solvent supplied from the solvent nozzle and dropped from the substrate with the rotation of the substrate is stored in the groove-typed solvent storage portions.

7. The coating processing apparatus of claim 1, wherein the solvent supply part includes an inner solvent supply part installed inside the cup body,
    wherein the inner solvent supply part is formed in an annular shape in which a plurality of solvent discharge holes is formed along the circumferential direction of the cup body.

8. A coating liquid collecting member for use in a coating apparatus configured to supply a coating liquid onto a substrate horizontally held by a substrate holding part that is installed inside a cup body, and discharge the coating liquid dropped from the substrate being rotated via an annular exhaust path formed along a circumferential direction of the cup body between an inner peripheral surface of the cup body and an inner member of the cup body, the coating liquid collecting member being installed to cover the annular exhaust path, and the coating liquid collecting member being used in the coating processing apparatus of claim 1.

* * * * *